United States Patent [19]

Ko

[11] Patent Number: 4,472,873
[45] Date of Patent: Sep. 25, 1984

[54] METHOD FOR FORMING SUBMICRON BIPOLAR TRANSISTORS WITHOUT EPITAXIAL GROWTH AND THE RESULTING STRUCTURE

[75] Inventor: Wen-Chuang Ko, San Jose, Calif.

[73] Assignee: Fairchild Camera and Instrument Corporation, Mountain View, Calif.

[21] Appl. No.: 313,875

[22] Filed: Oct. 22, 1981

[51] Int. Cl.³ ................ H01L 21/265; H01L 21/76
[52] U.S. Cl. ............................ 29/576 B; 29/571; 29/578; 29/576 W; 148/1.5; 148/188; 148/191; 357/34; 357/47; 357/56; 357/52; 357/50
[58] Field of Search ............ 29/571, 576 B, 576 W, 29/578; 148/1.5, 178, 188, 189, 191; 357/50, 47, 52, 55, 56, 24, 34

[56] References Cited

U.S. PATENT DOCUMENTS 4,111,720  9/1978  Michel et al. ............... 357/91 X
4,140,558  2/1979  Murphy et al. ............. 29/576 W X
4,240,092 12/1980  Kuo .............................. 29/571 X Primary Examiner—Brian E. Hearn
Assistant Examiner—David A. Hey
Attorney, Agent, or Firm—Kenneth Olsen; Carl L. Silverman; Alan H. MacPherson

[57] ABSTRACT

A vertical bipolar transistor is fabricated in a semiconductor substrate without an epitaxial layer using oxide isolation and ion implantation techniques. Ion implantation energies in the KEV ranges are used to implant selected ions into the substrate to form a collector region and buried collector layer less than 1 micron from the surface of the device, and then to form a base region of opposite conductivity type in the collector layer and an emitter region of the first conductivity type in the base region. Even though ion implantation techniques are used to form all regions, the base and the emitter regions can, if desired, be formed to abut the field oxide used to laterally define the islands of semiconductor material. The field oxide is formed to a thickness of less than 1 micron and typically to a thickness of approximately 0.4 microns, thereby substantially reducing the lateral oxidation of the semiconductor silicon islands and making possible devices of extremely small size, typically around 16–18 square microns. During the implantation of channel stop regions between the islands of semiconductor material a thin oxide layer is used to screen the underlying silicon from forming oxidation-induced stacking faults by the subsequent high dose field implantation and oxidation. A nitrogen anneal following this implantation and prior to forming the field oxide further reduces the frequency of stacking faults.

18 Claims, 6 Drawing Figures

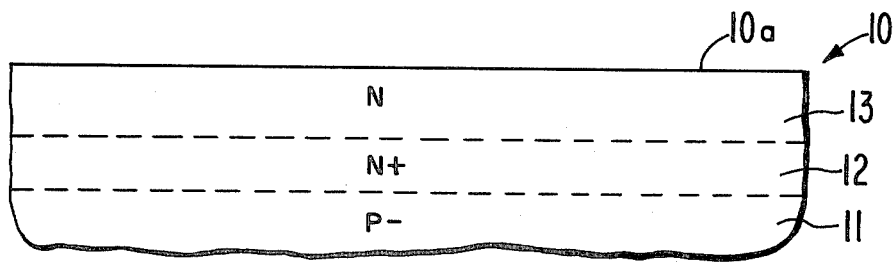
FIG.1A
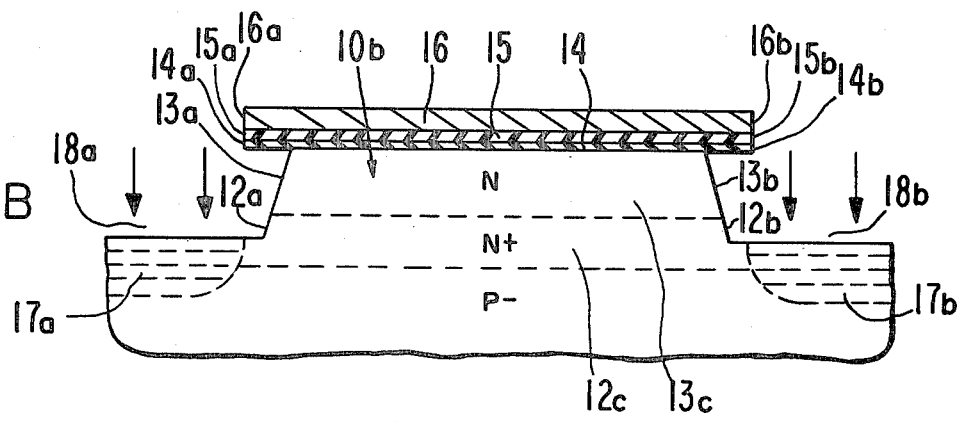
FIG.1B
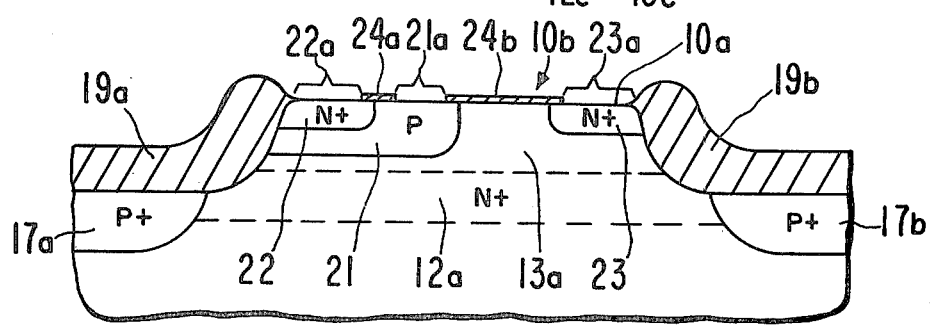
FIG.1C
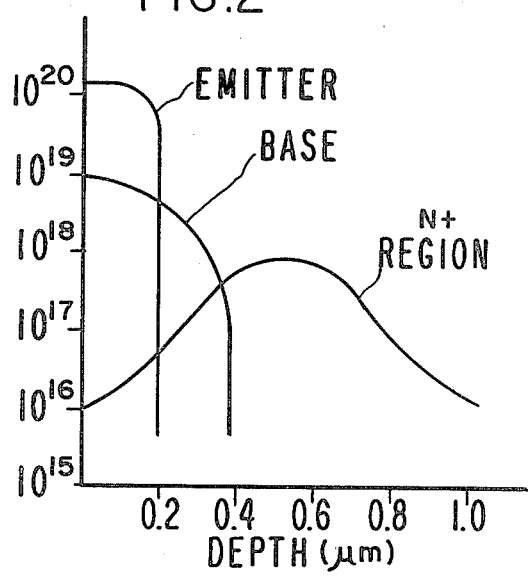
FIG.2
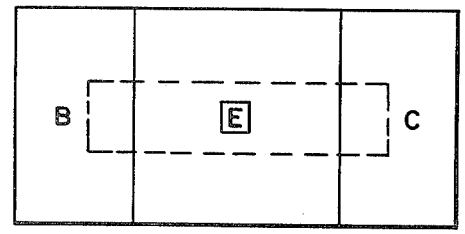
FIG.3A
FIG.3B

METHOD FOR FORMING SUBMICRON BIPOLAR TRANSISTORS WITHOUT EPITAXIAL GROWTH AND THE RESULTING STRUCTURE

BACKGROUND OF THE INVENTION

1. Field of the Invention

This invention relates to bipolar transistors and, in particular, to a bipolar transistor capable of being used in a bipolar memory cell of smaller size than heretofor achieved.

2. Prior Art

Various ways have been proposed to isolate electrically a plurality of pockets of semiconductor material in each of which one or more circuit elements can be formed. Two goals of these various isolation methods have been to reduce the size of the isolation regions in proportion to the total area of silicon available for the formation of active devices and to decrease the size of the active devices. Among the proposed isolation techniques have been appropriately biased PN junctions (Noyce, U.S. Pat. No. 3,117,260, issued Jan. 7, 1964), combinations of PN junctions and zones of intrinsic and extrinsic semiconducting materials (Noyce, U.S. Pat. No. 3,150,299, issued Sept. 22, 1964), dielectric isolation (Frescura U.S. Pat. No. 3,391,023, issued July 2, 1968), mesa etching (Frescura et al. U.S. Pat. No. 3,489,961, issued Jan. 13, 1970) and selectively doped polycrystalline silicon between islands of single crystal silicon of opposite conductivity type (Tucker and Barry U.S. Pat. No. 3,736,193, issued May 29, 1973). A major improvement in packing density was achieved by a method and structure disclosed by Peltzer wherein a thin silicon epitaxial layer was subdivided into electrically isolated pockets by a grid of oxidized regions of the epitaxial silicon material extending through the epitaxial material to an underlying laterally extending isolation PN junction (Peltzer, U.S. Pat. No. 3,648,155, issued Mar. 7, 1972).

Peltzer recognized that the use of diffused regions for isolation and for the formation of active semiconductor devices resulted in larger, less well-defined, circuits than desired for many applications and thus replaced the diffused isolation regions with field oxide.

Smith in U.S. Pat. No. 4,025,364 further improved the Peltzer structure by using ion implantation techniques for simultaneously fabricating epitaxial resistors, base resistors and vertical transistor bases. The result was a further decrease in device size and manufacturing complexity.

Michel et al in U.S. Pat. No. 4,111,720 issued Sept. 5, 1978 disclosed a method for forming a non-epitaxial bipolar integrated circuit. Michel et al first formed recessed silicon dioxide regions in a silicon substrate of one type conductivity. These recessed regions extended into the substrate and laterally enclosed at least one silicon substrate region of one type conductivity. Michel et al then formed by ion implantation a first region of opposite type conductivity fully enclosed laterally by the recessed silicon dioxide (the dopant concentration peak of this first region is below the surface of the first region) and then formed a second region of one type conductivity which extends from the surface into the first region of opposite type conductivity to a point between the concentration peak of this first region and the surface. Finally, Michel et al formed a third region of opposite conductivity type which extended from the surface partway into the second region of one type conductivity. The Michel et al method preferably used an ion beam energy level of at least one MEV with a concentration peak in the first region at least one micron below the surface (Michel et al, column 3, lines 12-14). The silicon dioxide regions were formed about 5 microns into the substrate (Michel Pat. No. 4,111,720, column 3, line 53). The elimination of the epitaxial layer from the structure removed one high temperature process which resulted in a substantial change in location of diffused subcollectors (low resistive conductive paths for carrying the collector current) formed in the substrate beneath the epitaxial layer. Notwithstanding the extensive use of ion implantation, the structure disclosed in the Michel et al patent is still considerably larger in size than required to achieve the packing densities associated with very large scale integrated circuits.

To prevent unwanted channelling between adjacent islands of isolated silicon material, the prior art has in numerous references taught the use of more heavily doped channel stop regions in the semiconductor material underlying the isolation between adjacent islands of silicon material. U.S. Pat. No. 3,748,187 discloses a method for forming a channel stop region wherein a mask is formed over the surface of the wafer, portions of the mask overlying to-be-formed grooves in the underlying silicon material are removed and grooves are formed in the silicon material by a method which underetches the lateral portions of the masks. The exposed bottoms of the grooves are then implanted with an impurity. The overhangs of the mask extending from the islands of silicon material protect the underlying portions of the grooves from being implanted with the selected dopant. Consequently, the more heavily doped portions of the substrate at the bottom of the grooves are laterally spaced from the diffusions of the active devices (such as sources, drains or emitters and bases) on opposite sides of the to-be-formed field oxide above the more heavily doped regions.

In keeping with the trend toward use of ion implantation techniques, U.S. Pat. No. 3,841,918 on an invention of Argraz-Guerena et al discloses ion implanting impurities through a mask into an epitaxial layer to form a deep collector contact zone having a well-controlled number of impurities and therefore a well-controlled resistivity. However, even this particular process fails to achieve the significant advantages which I have discovered are capable of being achieved using ion implantation techniques.

SUMMARY OF THE INVENTION

In accordance with my invention, a vertical bipolar transistor is fabricated in a substrate using oxide isolation and ion implantation techniques without an epitaxial layer. The structure of this invention yields a significant reduction in the size of active devices and thereby a substantial increase in packing density over the prior art without deviating from the use of standard well-known processing techniques. The active regions of the semiconductor devices fabricated in accordance with this invention differ from the prior art structures in that a field ion implantation is used in combination with oxide isolation to define the active regions whereas the prior art defines these regions solely with oxide isolation. In accordance with this invention, the active device junctions are formed within about one micron or less of the device surface thereby achieving a substantial reduction in device size and a commensurate increase in device speed.

In accordance with one method of this invention, the device structure can be fabricated with only four masking steps before metallization. Contrary to the prior art wherein energy for the ion implantation of the buried collector region is in excess of one MEV, energies in the KEV ranges are used to implant selected ion beams into the substrate to form conventional regions of the active devices.

In one embodiment, phosphorus ions are implanted into a P type substrate to form conventional buried layers and bipolar transistors. Phosphrous ions are implanted blankly in a sheet implantation over the substrate where the active device areas are to be subsequently defined by oxide isolation. Alternatively, the oxide isolation is defined prior to the sheet implantation. Prior to field oxidation, boron is implanted in the field area (preferably through a thin protective dielectric) to prevent field inversion. The base and emitter regions are then formed in the active device areas by boron and arsenic implantation, respectively, and annealing. In one embodiment, emitter-base, base-collector and collector-substrate junctions are about 1,000 Å to 2,500 Å, 2,500 Å to 4,000 Å, and 8,000 Å to 10,000 Å, respectively from the surface. Shallow junctions and oxide isolation allow bipolar transistors with only about 15 square microns or less active area to be fabricated for use in very large scale integration ("VLSI") technology.

DESCRIPTION OF THE DRAWINGS

FIG. 1A shows in cross section a semiconductor substrate of a type appropriate for use with this invention;

FIG. 1B illustrates the cross section of FIG. 1A partially processed in accordance with the techniques of this invention to produce an overhanging mask suitable for blocking implanted ions from entering portions of the semiconductor material beneath the overhanging mask;

FIG. 1C illustrates the substrate of FIG. 1A further processed in accordance with this invention to provide isolated islands of semiconductor material suitable for the formation of active semiconductor devices in accordance with this invention;

FIG. 2 illustrates the impurity distribution through the semiconductor substrate illustrated in FIG. 1C; and, FIGS. 3A and 3B illustrate a top view of a semiconductor device constructed in accordance with one embodiment of this invention.

DETAILED DESCRIPTION

The following description is meant to be illustrative only and is not intended to limit the scope of this invention. The drawings referred to in this description are understood to be not drawn to scale (except for FIGS. 3A and 3B) and to illustrate only one portion of an integrated circuit constructed in accordance with this invention.

FIG. 1A illustrates a semiconductor substrate 10. In accordance with one embodiment of this invention median energy phosphorous ions are blanketly implanted (i.e. uniformly implanted over the whole surface) into P− type substrate 11 to form a region of N+ conductivity beneath the surface 10a of substrate 10. Using a dose of $1\times10^{14}$ cm$^{-2}$ and a total subsequent heat cycle of 1,000° C. for 0.5 hours, this implantation yields an N type surface concentration of about $1\times10^{16}$ cm$^{-3}$ and a peak concentration of about $2\times10^{18}$ cm$^{-3}$ at about 5,000 Å depth. This implantation converts the P type one micron subsurface layer 11 into an N type layer 13 with an N+ buried layer 12, all as shown in FIG. 1A. The peak concentration of the N+ layer is about 5,000 Å beneath the surface 10a. (This sheet implantation can be implanted into the substrate where the active device region is subsequently defined by oxide isolation or the oxide isolation region can be formed prior to the implantation.)

Next, the substrate is oxidized to form oxide layer 14. A silicon nitride layer 15 is deposited on the oxide layer 14 to yield a composite layer of silicon oxide 14 and silicon nitride 15, as shown in FIG. 1B. Techniques for oxidizing semiconductor wafers and for providing silicon nitride layers are well known in the semiconductor arts and thus will not be described in detail.

The composite layer of silicon oxide 14 and silicon nitride 15 is then patterned using photoresist 16 to define the active device areas on the wafer. This is done using standard photolithographic techniques. The composite layer of silicon oxide 14 and silicon nitride 15 is then removed by using a well known plasma etch to expose the top surface 10a of silicon substrate 10 underlying oxide layer 14. A portion of the silicon 10 is then removed using well known plasma etch techniques to form grooves 18a and 8b in the silicon surrounding each region 10b of semiconductor material in which active devices are to be formed. Region 10b of silicon material is defined by leaving over the top surfaces composite layers of silicon oxide 14 and silicon nitride 15 so as to protect the region of silicon from etching. Overlying silicon nitride 15 as shown in FIG. 1B is a layer of photoresist 16 used to pattern the oxide and nitride layers 14 and 15, respectively. Typically, photoresist 16 comprises A21350J.

The plasma etch forms grooves 18a and 18b between adjacent islands of semiconductor material in which are to be formed active devices. In forming grooves 18a and 18b using plasma etching, the etching conditions (the substrate bias and the proper gas mixture for the plasma) are adjusted so that the overhang of the dielectric layers will serve as an ion implantation mask for subsequent field implantation. Alternatively, a conventional wet chemical etch can also be used to form the grooves in a well-known manner with the etch undercutting the silicon 10 underlying the edges 14a, 15a, 16a, 14b, 15b and 16b of silicon oxide layer 14, silicon nitride 15 and photoresist 16. These protrusions of the oxide, nitride and photoresist extend appproximately 4,000 Å beyond the edges 13a and 13b of N type silicon region 13c and edges 12a and 12b of N plus type silicon region 12c. This overhang serves as an implantation mask for subsequent field implantation of P type impurities in the bottom of the grooves. Typically, the implantation of the field regions employs boron for the situation where the substrate region 11 is P type as shown. This boron serves, in a well-known manner, as a "channel stopper" and breaks up the buried collector N+ region 12 between adjacent islands by forming implanted P type regions such as 17a and 17b in the bottom of the grooves 18a and 18b respectively.

Next, the grooves are oxidized to form oxide over the field of the device. Upon completion of the oxidation, the nitride layer 15 is stripped thereby to provide a structure containing field oxide regions such as regions 19a and 19b (FIG. 1C) formed over the grooves 18a and 18b and the sides 12a, 13a, 12b, 13b of silicon island 10b. The oxide region includes a well-known "birdbeak" configuration of the type disclosed in U.S. Pat. No. 3,936,858. In the '858 patent however, no grooves are formed in the surface of the semiconductor material prior to the ion implantation of the channel stopper regions. Consequently, the rise of the field oxide above the top surface 10a of silicon region 10b is less in the structure of FIG. 1C than in the structure shown in the '858 patent.

Following the oxidation of the field to form oxide regions 19a and 19b, nitride layer 15 and any oxide formed on nitride 15 are stripped from the device. The base implantation area is then defined by forming photoresist over oxide layer 14. Photolithographic techniques are then used to define the base implantation area and the base is then implanted, using boron in one embodiment. Base region 21 of P type conductivity is shown in FIG. 1C. The surface 10a of the wafer is deposited with a nitride layer and a chemically deposited silicon dioxide layer 24. A nitride mask is used to pattern all the contact regions 21, 22 and 23 through chemically deposited silicon dioxide and nitride layer 24. An emitter mask is then used to define emitter and collector regions for emitter implantation. Contact regions are then formed by implanting a donor impurity (arsenic, in one embodiment).

Wafer 10 is then heated to anneal the implant damage and to drive in the ion-implanted impurities. Following this annealing, the base contact region 21a emitter contact region 22a and collector contact region 23a are then defined by dipping the substrate in diluted HF solution to etch thin oxide in the contacts, and the substrate is ready for metallization.

As a feature of this invention, the active device region includes a base region 21, one portion of which abuts oxide 19a, an emitter region 22, one portion of which abuts oxide 19a to form a "walled" emitter, and a collector contact region 23 a portion of which abuts oxide region 19b. The use of a "walled" emitter is disclosed, for example, in U.S. Pat. No. 3,648,125, issued Mar. 7, 1972 on an invention of Peltzer. However, this invention is unique in that it permits the use of a walled emitter even when the emitter region is formed using ion implantation techniques as opposed to standard diffusion techniques. Contrary to the prior art, this invention does not require the use of MEV ion implantation techniques which result in severe damage to the semiconductor material and particularly that material abuting the oxide. This invention also does not require the implantation of heavy phosphorous species such as $^{31}P+$ and $(^{31}P)_4+$ to achieve a tail portion on the surface to prevent surface inversion. Thus, the vertical depth of transistors made using the present invention is within one micron of the surface 10a of the silicon material comprising wafer 10 contrary to the prior art wherein such structures were only capable of being formed to a much deeper depth (typically around 3.5 microns).

EXAMPLE

In implementing one embodiment of this invention, a wafer of approximately 500 micron thickness of P type conductivity and a 5–10 ohm —cm resistivity is initially oxidized to an oxide thickness of approximately 250 Å±20 Å by placing the wafer in a 1000° C. dry oxygen environment for about 10 minutes. Following the formation of this thin oxide layer 14 (FIG. 1B) a silicon nitride layer of approximately 1200 Å±100 Å thickness is formed on the surface of the oxide layer 14 by a standard technique well known in the arts. The nitride layer is then oxidized at 1,000° C. for 60 minutes in steam to form a thin oxide layer over the top of the nitride to a thickness of about 50 Å. The wafer is next masked using well-known photolithographic techniques to remove the oxide and nitride layers overlying the to-be-formed field regions of the device but to leave these layers over the silicon in which the active regions of the device are to be formed. To do this the wafer is placed in a 500 etch (a diluted hydrofluoric acid) for removal of oxide for approximately 20 seconds and then a nitride etch (a standard phosphoric acid etch of well-known composition) for about 45 minutes to remove the nitride. This is followed by a second "500" etch to etch the silicon dioxide layer 14 and by a silicon etch to etch the underlying silicon substrate 10 to a depth of approximately 4000–6000 Å. Following this etch, the structure looks as shown in FIG. 1B.

Next the silicon wafer is placed into a 1,000° C. dry oxygen environment for about 10 minutes to form an oxide layer over the silicon exposed by the grooves to a thickness of about 200–300 Å. In one embodiment this thickness was 274 Å.

This oxide serves as a screen to protect the underlying silicon from forming oxidation-induced stacking faults by the subsequent high dose ($>10^{15}$ cm$^{-2}$) field implantation and oxidation.

Following the formation of this thin screening oxide selected impurity ions are implanted into the silicon underlying the groove. That silicon underlying the extensions 14a, 15a, 16a, 14b, 15b and 16b of the mask material is not implanted with these ions but the ions do implant in the silicon underlying the screening oxide not protected by these overhangs of the masking material. Typically, boron ions or boron difluoride ions (BF$_2^+$) at 10–50 KEV are used and in the preferred embodiment 45 KEV of boron BF$_2^+$ ions are employed to achieve an implantation dose of $1 \times 10^{15}$ cm$^{-2}$. Thus, the dosage (which is a function of the ion beam current times time, divided by the implantation area) as specified above gives the desired impurity concentration at a given depth in the silicon material in the bottom of the grooves 18a, 18b. Techniques for ion implanting are well known and thus will not be described in detail. In this embodiment, the preferred condition for implantation of the field channel stop regions is 45 KEV for BF$_2^+$ or 20 KEV for B+ ions to achieve a dose of $10^{15}$ cm$^{-2}$ to $2 \times 10^{15}$ cm$^{-2}$.

Following the implantation of the boron ions, the field of the device is annealed and then oxidized to about 4,000 Å ±400 Å thickness by placing the wafer in a 1,000° C. environment of nitrogen for thirty (30) minutes, and then oxygen for five (5) minutes, then steam for sixty (60) minutes and oxygen for five (5) minutes. Following the formation of the field oxide, the wafer is subjected to a "500" etch for 15 seconds to remove the thin oxide formed over any nitride on the wafer and is then subjected to a phosphoric etch to remove nitride layer 15. Oxide layer 14 is retained on the wafer. This oxide is approximately 250 Å±20 Å thick.

Following the stripping of the nitride, phosphorous ions are implanted into the island 10b of wafer 10 using 200 KEV P++ phosphorous ions to achieve a dosage of $1 \times 10^{14}$ cm$^{-2}$. In an alternative embodiment, the P++ ions were implanted to a dosage of $3 \times 10^{14}$ cm$^{-2}$ using 200 KEV beam.

The result of this implant is to form N+ region 12 and N region 13 such that N+ regions 12 is about 5,000 Å below the surface 10a of the device.

Following the formation of N+ region 12 and N region 13, the base region 21 is formed by masking the device with photo-resist. Techniques for forming the base mask are well known and thus will not be described in detail.

Base region 21 is then implanted using boron ions B+ with an energy of 25 KEV to a dosage of $1 \times 10^{14}$ cm$^{-2}$ and an 80 KEV boron ion beam is used to an implantation dose of $1.5 \times 10^{13}$ cm$^{-2}$. In another embodiment, boron ions are implanted at an energy level of 25 KEV to a dosage of $1 \times 10^{14}$ cm$^{-2}$ and then at an energy level of 100 KEV to a dosage of $2.8 \times 10^{13}$ cm$^{-2}$. In forming the base implant, the portion of the silicon island 10b in which the boron ions are not to be implanted is covered not just with an oxide layer but also with a photo-resist (typically A21450J) to a thickness of 1 micron to absorb the boron ions and prevent them from being implanted in the silicon underlying the photo-resist. This resist is stripped following the base implant.

Wafer 10 is then cleaned and nitride is deposited on the wafer to a thickness of about 1,100 Å. Then chemically vapor deposited silicon dioxide to a thickness of about 2,000 Å is formed over the surface of the wafer 10. A nitride mask opening (not shown) is then formed using well-known photolithographic techniques and etchants to remove the oxide and the nitride overlying the emitter region 22, the base contact region 21 and the collector contact region 23. An emitter mask (not shown) is then used to define emitter and collector regions for implantation (base contact region is covered with photoresist to mask subsequent arsenic implantation). The arsenic ion AS+ is implanted at 50 KEV to a dosage of $5 \times 10^{15}$ cm$^{-2}$. The wafer is then again cleaned and annealed for 30 minutes in nitrogen at 970° C. and then contact opening (no mask) is carried out by dipping the wafer in diluted HF solution to etch away thin oxidation in contact openings 22a, 21a and 23a, respectively, to form the emitter, base and collector regions.

During the formation of the emitter region 22 by implantation of arsenic ions, collector contact region 23 is also simultaneously formed.

FIG. 2 illustrates the impurity distribution as a function of depth beneath surface 10a in the devices formed in accordance with this invention. The N+ region 12 has an impurity peak at about 0.5 microns beneath the surface 10a of semiconductor island 10b. The base region 21 forms a base-collector junction between base 21 and collector 13a about 0.4 microns beneath the surface 10a. The base-emitter junction between regions 21 and 22 is formed about 0.2 microns beneath the surface 10a of the wafer. The peak concentration of dopant in the subcollector region 12a is approximately $10^{18}$ atoms per cubic centimeter while the concentration of the base region is a maximum of about $1 \times 10^{19}$ atoms per cubic centimeter. The peak concentration of the emitter region is about $2 \times 10^{20}$ atoms per cubic centimeter.

The process of this invention involves fewer masks than prior art processes and fewer masks than used in MOS processes. For example, a typical HMOS process uses about 10 masks. The bipolar process of this invention uses 8 masks including four (4) for processing the silicon and forming the various active and passive regions within the silicon and four (4) for forming the metallization layer. The masks steps are as follows:

1. Isolation mask during which grooves 18a, 18b are formed.
2. Base mask.
3. Nitride mask.
4. Emitter mask.
5. Metal mask 1.
6. Via mask.
7. Metal mask 2.
8. Top side contact mask.

The described process yields a device about one order of magnitude smaller than currently available bipolar producs made using the current isoplanar-type process. The process is flexible with respect to the starting wafer. While the starting wafer typically is 5–20 ohm centimeters P type material with crystal structure <100>, crystal structure <111> or other crystal structures can also be used. However, the <100> structure is preferred because the etch characteristics of this material are symmetrical so as to give the proper slopes to sides 12a and 13a, and 12b and 13b of silicon pedestal 10b when etching the grooves 18a and 18b prior to field oxidation.

The use of arsenic to form the collector contact and emitter regions is preferred to yield the advantages associated with the diffusion characteristics of arsenic and silicon (i.e., a sharp cutoff of the arsenic impurity distribution within the silicon material and a comfortable fit of the arsenic atoms in the silicon lattice structure). By avoiding a misfit of the arsenic atoms in the silicon structure, substantial silicon damage is eliminated.

The retention of a thin layer of protective oxide on the surface of the device during all implantation steps has been discovered to significantly reduce the penetration of damage to the underlying silicon material due to the impact of ions during ion implantation and subsequent thermal annealing. This significantly improves the predictability of device performance.

The advantages of the above process are numerous. First, the thickness of oxide regions 19a and 19b is about 0.4 microns in one embodiment as opposed to 3-5 microns for prior art devices. The use of the combined protective field oxidation and field implant together with the overlying protrusions of the silicon masking layers 14a and 15a yields a field region which is separated from the active regions of the devices formed in silicon islands such as island 10b while at the same time protects the silicon material underlying the field oxide from damage due to the ion implantation. The minimum isolation width between devices can be reduced substantially by the process of this invention to on the order of two (2) microns from at least an order of magnitude greater than this in prior art devices. The oxide encroachment on the island of semiconductor material such as island 10b is limited to about 0.5 microns total during the formation of oxide regions 19a and 19b compared to approximately an order of magnitude greater encroachment using the techniques of the prior art. While the surface of the semiconductor wafer 10 is no longer substantially coplanar, the lack of coplanarity due to the thin oxide 19a and 19b is compensated for by the gentle sloping of the oxide regions 19a and 19b as shown, for example, in FIG. 1C, thereby preventing the cracking and breaking of conductive leads formed over the top surface of the wafer. The result is that devices made using this invention are at least an order of magnitude smaller than prior art devices. Moreover, the use of relatively low ion beam energies in the ion implantation step means that walled emitters and walled bases are capable of being manufactured using ion implantation techniques contrary to devides made using the prior art. The use of a thin oxide screen of about 300 Å thickness in the field during implantation of channel stops and the use of an initial nitrogen anneal following the field oxidation to achieve isolation is particularly advantageous to ensure good yield. To isolate the devices, the field implantation usually must achieve a doping of greater than about $2 \times 10^{18}/cm^3$ to break up the blanket buried layer comprising N+ region 12. This can be achieved by implanting the boron field through the thin screen oxide and then performing a short nitrogen anneal before the field oxidation. The B+ implant dose is greater than $1 \times 10^{15}/cm^2$ to achieve this.

While the above embodiment described the implantation of the buried layer 12 before the formation of the isolation oxide 19a and 19b (FIG. 1C) of course the buried region 12 can be formed after forming isolation oxide 19a, 19b if desired. The dosage required to form N+ layer 12 is such as to yield an impurity concentration of $10^{16}$ ions/cm³ at the surface 10a to about $10^{18}$ ions/cm³ about 0.5 microns beneath the surface 10a of wafer 10.

The above process yields a bipolar device which is capable of competing with MOS technology both in terms of price and performance.

Products made by this process are cheaper to manufacture than HMOS products because this process uses fewer masks. The small size of devices made by this process means that their performance is better than the performance of prior art bipolar devices. Elimination of the epitaxial reactor eliminates a substantial expense in the fabrication of devices. The simplicity of the invented process results in high manufacturing yields. The single phosphorous implantation is used to form both the buried layer and the collector region in which the base and emitter regions are to be formed.

Devices made by the process of this invention have potential use in 16K and 64K static RAMs.

The lateral encroachment of the thin field oxide regions 19a and 19b into silicon island 10b is typically at most point 0.5 microns total from the formation of a 0.4 micron thick silicon dioxide isolation oxide 19a and 19b using well known thermal oxidation techniques. Thermally-oxidized silicon results in an increase in thickness of the oxidized silicon by a factor of about 2.2; thus a 0.4 micron thick oxide layer 19a, 19b consumes about 0.2 microns of silicon. The results is that the structure made using this invention achieves a silicon island 10b approximately 1.5 microns on a side compared to prior art silicon islands of about 5.5 microns on a side. This significant decrease in device size yields a substantial improvement in device performance.

FIGS. 3A and 3B illustrate in plan view the difference in device size using the structure of this invention as opposed to the prior art. FIG. 3A illustrates the size of the base, emitter and collector contacts in scale compared to the prior art structures shown in FIG. 3B. The substantial size advantages resulting from use of the process of this invention are clearly discernible from this plan view of these regions.

In one embodiment, the sheet resistances of emitter, base and collector were about 25,500 and 250 ohms per square, respectively. If desired, the base and collector implantation can also be used to form resistors as can the emitter implantation but there will be no oxide passivation between resistor contacts (which is similar to resistors fabricated by arsenic capsule or sealed tube diffusion.

As a feature of this invention, the implant dose of $10^{15}/cm^2$ for the channel stop is about an order of magnitude higher than prior art dosages for this purpose and is made possible by the use of screening oxide during ion implantation and the subsequent nitrogen anneal.

Other embodiments of this invention will be obvious in view of the above to those skilled in the semiconductor arts. If desired, the conductivity types of the regions shown in FIGS. 1A to 1C can be reversed.

What is claimed is:

1. The process of forming a semiconductor structure having a substrate of a first conductivity type comprising:

forming a first region of opposite conductivity type in said substrate by ion implanting a selected impurity at a selected dosage into said substrate where the energy used for said ion implanting is selected so that the peak concentration of said impurity in said first region occurs less than 1 micron beneath the surface of said substrate; then, annealing said structure for a selected period of time sufficient to produce a tail portion of said first region extending to the surface of the substrate, said dosage being selected so that the concentration of said impurity in said tail portion at the surface of said substrate after said annealing is sufficient to prevent surface inversion in said structure.

2. The method of claim 1 wherein said substrate comprises silicon.

3. The method of claim 2 wherein said selected impurity is phosphorous, said selected dosage is about $1 \times 10^{14}$ ions/cm² to $3 \times 10^{14}$ ions/cm² and said energy level is approximately 200 KEV, so that the peak concentration of said impurity in said first region is at least about $2 \times 10^{18}$ atoms/cm³.

4. The method of claim 3 wherein the period of time for annealing said structure is selected so that the concentration of said impurity at said surface is approximately $1 \times 10^{16}$ atoms/cm³.

5. The method of claim 1 further comprising:

forming grooves of a selected depth in said substrate to leave islands of substrate in which active regions of said structure are to be formed, separated by said grooves;

forming a protective layer of material of a selected thickness over the bottom portion of said grooves;

implanting ions of said first conductivity type through said protective layer at a dosage of at least $1 \times 10^{15}$ ions/cm², thereby to form second regions of said first conductivity type in said substrate to electrically isolate said first regions of opposite conductivity type in each of said islands from the portions of said first region in the other islands; then, annealing said structure before performing the following oxidizing step; then oxidizing said structure to form an oxide layer over said grooves to a thickness no greater than approximately 1 micron, thereby to minimize the lateral encroachment of said oxide material, where the thickness of said protective layer is selected so that said implanting ions of said first conductivity type, annealing, and then oxidizing said structure does not cause stacking faults in said second regions beneath said grooves;

forming a base region of said first conductivity type in said first region by implanting ions of said first conductivity type in said first region;

forming an emitter region in said base region by ion implanting an impurity of said second conductivity type into said base region, said emitter region extending into said base region a selected distance less than the depth of base region extending into said first region;

forming a collector contact to that portion of said first region in which the base region is not formed;

forming insulation over the top surface of each of said islands of semiconductor material and forming contacts to selected portions of said emitter region, said base region and said first region.

6. The method of claim 5 wherein the base region is formed in said first region such that the base-collector junction of the to-be-formed device in said island is approximately 0.4 microns beneath the surface of said island.

7. The method of claim 6 wherein the emitter region is formed in said base region such that the emitter-base junction is approximately 0.2 microns beneath the surface of said island.

8. The method of claim 5 wherein the implantation of ions of said first conductivity type is accomplished using energy of approximately 10 to 50 KEV.

9. The method of claim 5 wherein said protective layer comprises an oxide of silicon.

10. The Method of claim 9 wherein said oxide of silicon comprises silicon dioxide formed by thermally oxidizing the surface of said silicon material.

11. The Method of claim 9 wherein said silicon dioxide layer has a thickness of 200–300 Å.

12. The Method of claim 11 wherein said silicon dioxide layer has a thickness of 270 Å.

13. The method of forming a channel stopper in a semiconductor structure containing a substrate which comprises:

forming a protective layer of material of a selected thickness over a portion of said substrate;

implanting ions through said protective layer using a dosage of at least $1 \times 10^{15}$ ions/cm$^2$ to form a channel stop region in said substrate beneath said protective layer; then annealing said structure before the following oxidizing step; then, oxidizing said structure to form an oxide layer over said portion of said substrate to a thickness no greater than approximately 1 micron, thereby to minimize the lateral encroachment of said oxide material, where the thickness of said protective layer is selected so that said implanting, annealing, and oxidizing does not cause stacking faults in said channel stop region.

14. The Method of claim 13 wherein said portion of said substrate is a groove in said substrate.

15. The Method of claim 14 wherein said substrate comprises silicon, and said protective layer comprises an oxide of silicon.

16. The Method of claim 15 wherein said annealing is carried out in nitrogen.

17. The Method of claim 15 wherein said oxide of silicon has a thickness of 200 Å to 300 Å.

18. The Method of claim 15 wherein said oxide of silicon comprises a thermally grown oxide of silicon.

* * * * *

UNITED STATES PATENT AND TRADEMARK OFFICE
CERTIFICATE OF CORRECTION

PATENT NO. : 4,472,873
DATED : September 25, 1984
INVENTOR(S) : Wen-Chuang Ko

It is certified that error appears in the above-identified patent and that said Letters Patent is hereby corrected as shown below:

Column 1, line 38, "3,648,155" should read -- 3,648,125 --.

Signed and Sealed this

Tenth Day of June 1986

[SEAL]

Attest:

DONALD J. QUIGG

Attesting Officer  Commissioner of Patents and Trademarks